(12) United States Patent
Ho et al.

(10) Patent No.: US 6,707,722 B2
(45) Date of Patent: Mar. 16, 2004

(54) METHOD AND APPARATUS FOR REGULATING PREDRIVER FOR OUTPUT BUFFER

(75) Inventors: Duc Ho, Allen, TX (US); Gary L. Howe, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/202,556

(22) Filed: Jul. 23, 2002

(65) Prior Publication Data

US 2004/0017696 A1 Jan. 29, 2004

(51) Int. Cl.[7] .................................................. G11C 7/00
(52) U.S. Cl. .............................. 365/189.05; 365/189.11
(58) Field of Search ....................... 365/189.05, 189.11, 365/149

(56) References Cited

U.S. PATENT DOCUMENTS 5,602,783 A * 2/1997 Ong ....................... 365/189.05
5,805,505 A * 9/1998 Zheng et al. .......... 365/189.05
6,330,194 B1 * 12/2001 Thomann et al. ...... 365/189.05

* cited by examiner

Primary Examiner—Tan T. Nguyen
(74) Attorney, Agent, or Firm—Snell & Wilmer, L.L.P.

(57) ABSTRACT

An improved predriver circuit for an output buffer is provided that can enable the output buffer to operate well within maximum and minimum IOL current specifications at lower internally regulated voltages. The predriver circuit comprises a limiter device configured to limit or otherwise regulate the maximum gate voltage provided to the gate of the pull-down transistor device. As a result, the pull-down transistor device can be sized optimally to provide additional margin to exceed the minimum IOL specification, while also improving the margin under the maximum IOL specification. The device is configured to limit the maximum gate voltage of the output pull-down transistor device to less than the maximum external power supply voltage.

38 Claims, 7 Drawing Sheets

METHOD AND APPARATUS FOR REGULATING PREDRIVER FOR OUTPUT BUFFER

TECHNICAL FIELD

The present invention relates, generally, to memory systems. More particularly, the present invention relates to a regulated predriver for an output buffer, such as may be utilized for memory applications.

BACKGROUND OF THE INVENTION

In the efforts for optimizing power consumption in various high-speed microcontroller-based devices, such as portable personal computers (PCs), personal digital assistants (PDAs) and the like, significant attention has been given to the further improvement of battery life. One area where battery life has been increased is through the development of improved memory devices.

For example, most new microprocessor-based applications that are configured for high processing speed now implement synchronous, dynamic random access memory (SDRAM) devices that can operate at significantly higher clock speeds than conventional memory devices. SDRAM devices are synchronized with the clock speed in which the microprocessor is optimized, thus enabling the number of instructions that the microprocessor can perform at a given time to be increased. Testing has demonstrated that a 25% to 30% increase in battery life can result from increasing the quantity of SDRAM devices in a portable computer system. This result is due mainly to the reduction in use of the hard drive that tends to deplete the battery life.

In the manufacture of SDRAM devices, a further reduction in process geometries has been made in an attempt to manufacture more SDRAM devices per semiconductor wafer. This reduction in SDRAM process geometries has resulted in a further scaling down of internal operating voltages that may be used in output buffer devices. However, external power supply specifications have remained at higher levels for such output buffers.

For example, with reference to FIGS. 1A and 1B, an output buffer 100 as may be implemented within an SDRAM device comprises a control logic and pull-up predriver circuit 102 for controlling and driving a pull-up transistor and a control logic and pull-down predriver circuit 104 for controlling and driving a pull-down transistor. The pull-up transistor can comprise either a p-channel transistor $M_{P0}$ (FIG. 1A) or an n-channel transistor $M_{N0}$ (FIG. 1B), while the pull-down transistor can comprise an n-channel transistor $M_{N2}$. Pull-up transistors $M_{P0}$ and $M_{N0}$ and pull-down transistor $M_{N2}$ are further connected to a bondpad 106. Control logic and predriver circuits 102 and 104 can be configured with an internally supplied voltage $V_{CCR}$ to drive the gates of pull-up transistors $M_{P0}$ and $M_{N0}$ and pull-down transistor $M_{N2}$.

In older predriver schemes, the internally regulated voltage $V_{CCR}$ comprises approximately 2.5 volts. However, as a result of shrinking process geometries, a lower internally regulated voltage $V_{CCR}$ comprising approximately 1.8 volts can be required. At this lower level of internally regulated voltage $V_{CCR}$, pull-down transistor $M_{N2}$ must be made large enough to meet the I/O current specifications for DC operation, e.g., a larger output pull-down transistor $M_{N2}$ is required to meet the external power supply specifications of 3.0 to 3.6 volts for SDRAM devices. In addition, pull-down transistor $M_{N2}$ must be configured to address the AC access and hold timing considerations. Further, since silicon area is at a premium under current manufacturing conditions, it is highly preferable to drive the gate of output pull-down transistor $M_{N1}$ with a significantly higher voltage supply.

With reference to FIG. 2, the current-voltage (IV) curves for the input/output current specifications for output pull-down transistor $M_{N1}$ for an output buffer 100 include a curve 202 representing the maximum driver sink current (IOL) specification and a curve 204 representing the minimum driver sink current (IOL) specification. IOL is a DC specification for the amount of current that output buffer 100 will sink when driving a low (0) signal on bondpad 106, i.e., when a low signal voltage is forced at bondpad 106 while pull-down transistor $M_{N2}$ is turned on.

In order to meet the minimum IOL current specification, output pull-down transistor $M_{N2}$ is sized such that an IOL current characteristic 208 will exceed the minimum IOL current specification 204 under lowest input/output conditions, i.e., higher temperature, lower IDS process corner, and lower voltage $V_{CCQ}$, while also being sized such that an IOL current characteristic 206 will not exceed the maximum IOL current specification 202 under highest input/output conditions, i.e., lower temperature, higher IDS process corner, higher voltage $V_{CCQ}$. As is evident from FIG. 2, in the event the gate voltage of output pull-down transistor $M_{N2}$ is not limited, e.g., allowed to increase to 3.6 volts, the current/voltage characteristics of output pull-down transistor $M_{N2}$ approaches the maximum IOL current specification 202, or even exceeds under worst case conditions.

Thus, in the newer, lower internally regulated voltage schemes, a larger output pull-down transistor $M_{N2}$ is required to meet AC and DC specifications, which comes at a cost of silicon area. Further, a significantly larger pull-down transistor $M_{N2}$ increases the difficulty in meeting the maximum output specifications for output buffer 100. Moreover, if the voltage for driving the gate of output pull-down transistor $M_{N2}$ is level shifted upwards to the external voltage $V_{CCQ}$ of 3.6 volts, then output pull-down transistor $M_{N2}$ can be suitably overdriven to exceed maximum IOL current specification 202.

SUMMARY OF THE INVENTION

In accordance with various aspects of the present invention, a memory system includes an improved predriver circuit for an output buffer that can enable the output buffer to operate well within maximum and minimum IOL current specifications at lower internally regulated voltages. In accordance with an exemplary embodiment, the predriver circuit comprises one or more predriver devices and a regulated limiter circuit configured to limit or otherwise regulate the maximum gate voltage provided to the gate of an output pull-down element. As a result, the device size of the output pull-down element can be optimized to provide additional margin to exceed the minimum IOL specification, while also improving the margin under the maximum IOL specification.

In accordance with an exemplary embodiment, the pull-down predriver circuit comprises one or more predriver elements, e.g., a p-channel pull-up transistor and an n-channel pull-down transistor, configured with the regulated limiter circuit; however, any predriver arrangement can be configured with the regulated limiter circuit. The regulated limiter circuit can be configured in various manners for limiting or otherwise regulating the maximum gate voltage provided to the gate of the pull-down element to less than the external power supply voltage, without reducing the gate voltage at the minimum voltage specification. For example, the regulated limiter circuit can comprise a single n-channel device, one or more diode-connected p-channel or n-channel transistor devices connected in series, or one or more series connected diode devices, configured to limit or otherwise regulate the gate voltage of the pull-down transistor device.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

The present invention may be described herein in terms of various functional components. It should be appreciated that such functional components may be realized by any number of hardware or structural devices configured to perform the specified functions. For example, the present invention may employ various integrated components, e.g., buffers, supply references, signal conditioning devices and the like, comprised of various electrical devices, e.g., resistors, transistors, capacitors, diodes and other components whose values may be suitably configured for various intended purposes. In addition, the present invention may be practiced in any integrated circuit application where an output buffer can be utilized. However for purposes of illustration only, exemplary embodiments of the present invention are described herein in connection with a memory chip application, such as for an SDRAM device. Further, it should be noted that while various components may be suitably coupled or connected to other components within exemplary circuits, such connections and couplings can be realized by direct connection between components, or by connection or coupling through other components and devices located thereinbetween.

Figure 1A:
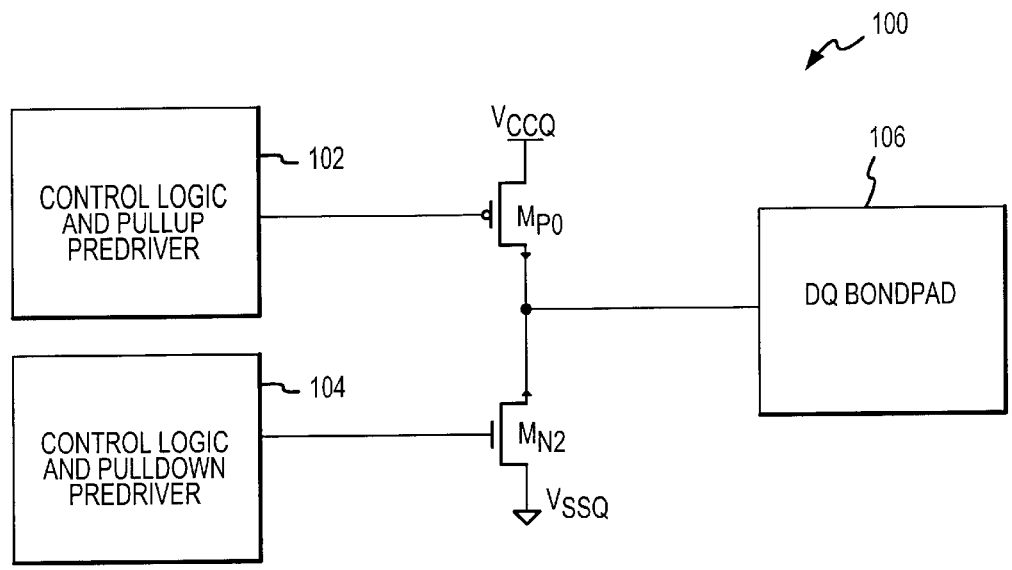
FIGS. 1A and 1B illustrate schematic diagrams illustrating prior art pull-down output buffers with control and predriver circuits.
Figure 1B:
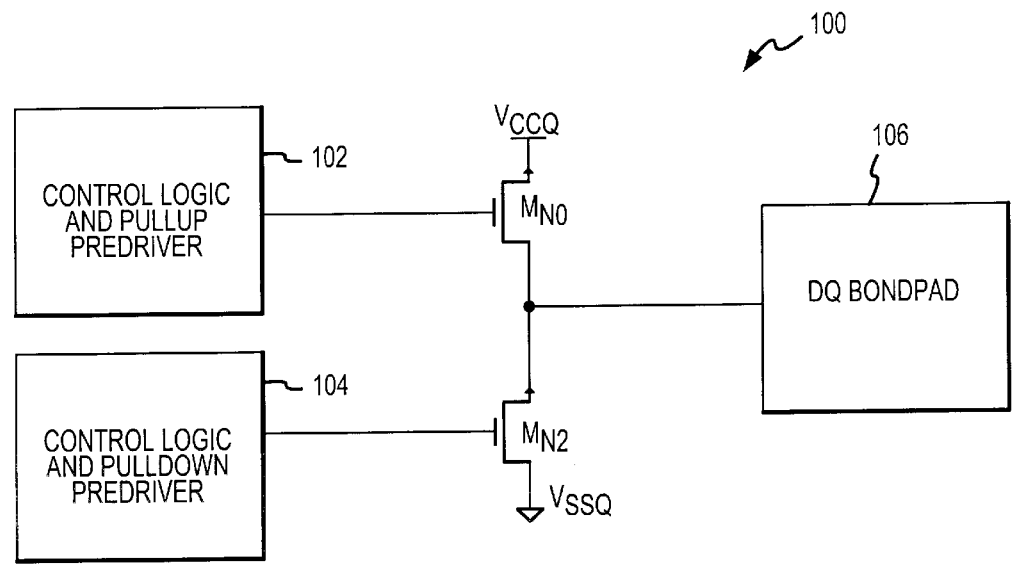
Figure 2:
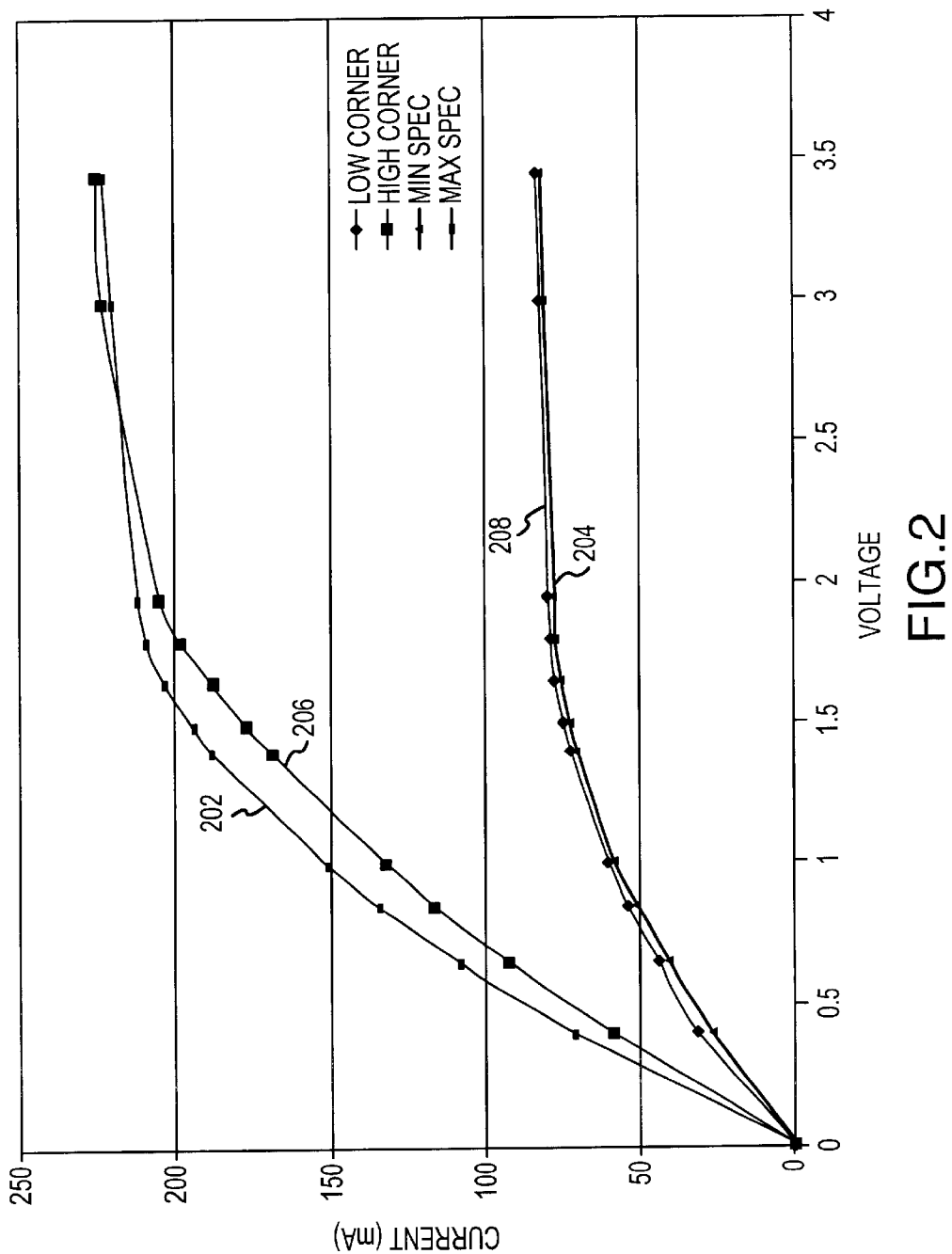
FIG. 2 illustrates a I-V diagram for operation for a pull-down transistor device configured with a prior art predriver circuit.
Figure 3A:
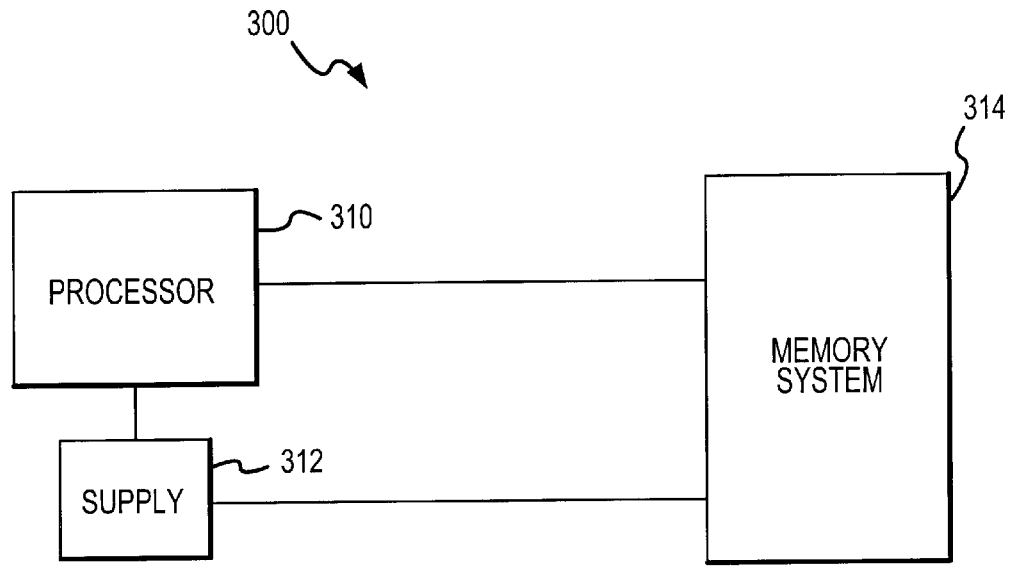
FIG. 3 illustrates an exemplary embodiment of an electronic system with a memory system in accordance with the present invention

An electronic system according to various aspects of the present invention includes a plurality of components operating in conjunction with a supply regulation circuit. The components may comprise any components using a supply regulation circuit, such as multiple integrated circuits and electrical components on a single board, various elements in a single integrated circuit, various components of a computer system, or any other components. For example, with reference to FIG. 3A, an exemplary electronic system 300 suitably comprises a computer having a processor 310, a supply 312, and a memory system 314. Processor 310 controls the electronic system 300, such as in accordance with a program. Processor 310 may comprise any controlling element, for example a conventional central processing unit, such as an Intel Pentium processor or an Advanced Micro Devices Athlon processor.

Supply 312 provides power to the various components of electronic system 300, including processor 310 and memory system 314. Supply 312 may comprise any source of power for electronic system 300, such as a conventional electric power supply, a charge pump, and/or other power supplies. In the present embodiment, supply 312 is connected to processor 310 and is configured to supply at least two voltage levels. Although the present embodiment includes the processor 310, supply 312, and memory system 314, electronic system 300 may include any suitable components.

Figure 3B:
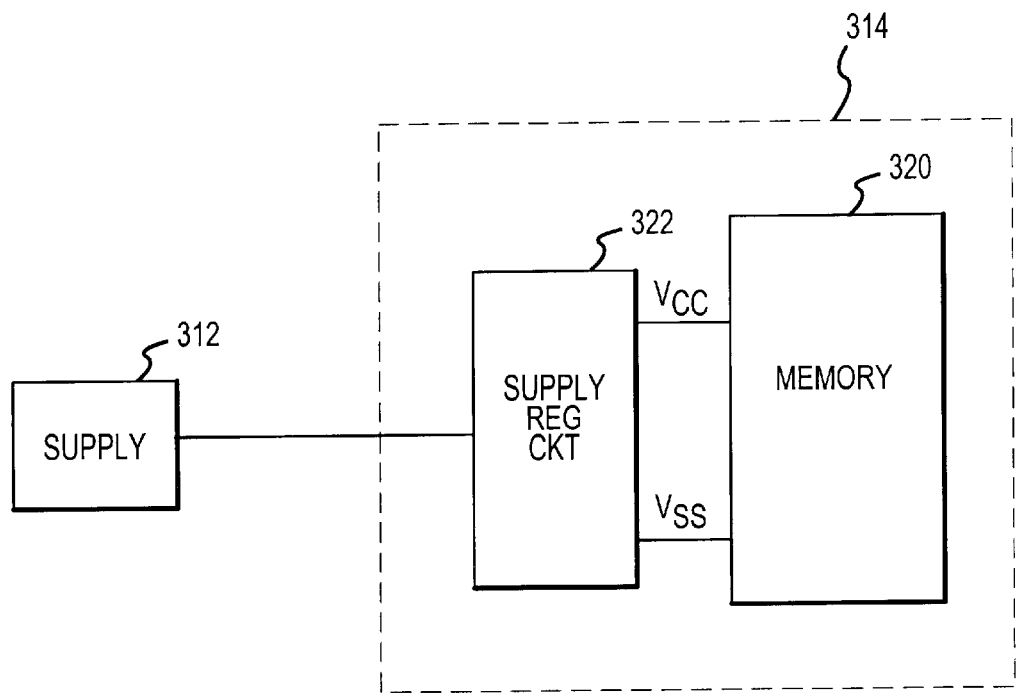

Memory system 314 stores information for subsequent retrieval. Memory system 314 may comprise any appropriate memory, memory system, or storage device or system. Memory system 314 may comprise, be replaced by, or be supplemented by any component or system drawing power from supply 312. Memory system 314 is suitably connected to processor 310 and configured to provide information to processor 310. For example, with reference to FIG. 3B, memory system 314 of the present embodiment suitably comprises a memory 320 and a supply regulation circuit 322. Memory 320 comprises any suitable system for storing data for later retrieval, such as a memory subsystem including a memory controller, multiple memory chips, and associated logic and circuitry. In the present embodiment, memory 320 comprises an SDRAM, such as an SDRAM available from Micron Technology, Inc. Memory 320 suitably includes multiple word lines and bit lines used to store information at selected addresses in memory 320.

Supply regulation circuit 322 controls the supply levels to one or more components of electronic system 300, such as memory 320. In the present embodiment, supply regulation circuit 322 is integrated into memory 320, though supply regulation circuit 322 may be integrated into other components of memory 320 or implemented as a separate circuit. Supply regulation circuit 322 according to various aspects of the present invention provides selected voltage levels to memory 320. In particular, supply regulation circuit 322 is connected to supply 312 to receive power and may be configured to generate, monitor, and regulate one or more particular voltages for memory 320. Supply regulation circuit 322 may comprise any suitable supply regulation circuit, such as a voltage control circuit, current control circuit, or any other supply regulation circuit or suitable combination of circuits. In the present embodiment, supply regulation circuit 322 is configured with an output buffer for regulating voltages within memory 320.

In accordance with various aspects of the present invention, an improved predriver circuit for an output buffer enables an output buffer to operate well within maximum and minimum IOL current specifications at lower internally regulated voltages. In accordance with an exemplary embodiment, the predriver circuit comprises one or more predriver transistors and a regulated limiter circuit configured to limit or otherwise regulate the maximum gate voltage provided to the gate of the pull-down element. As a result, the device size of the pull-down element can be optimized to provide additional margin to exceed the minimum IOL specification, while also improving the margin under the maximum IOL specification.

In accordance with an exemplary embodiment, the pull-down predriver circuit comprises a pair of predriver elements, for example a p-channel pull-up transistor and an n-channel pull-down transistor configured with the regulated limiter circuit. However, any arrangement of predriver elements for a predriver circuit for controlling and driving a gate voltage to an output pull-down element can be utilized. The regulated limiter circuit can be configured in various manners for limiting or otherwise regulating the maximum gate voltage provided to the gate of the output pull-down element to less than the external power supply voltage, without reducing the gate voltage at the minimum voltage specification.

Figure 4:
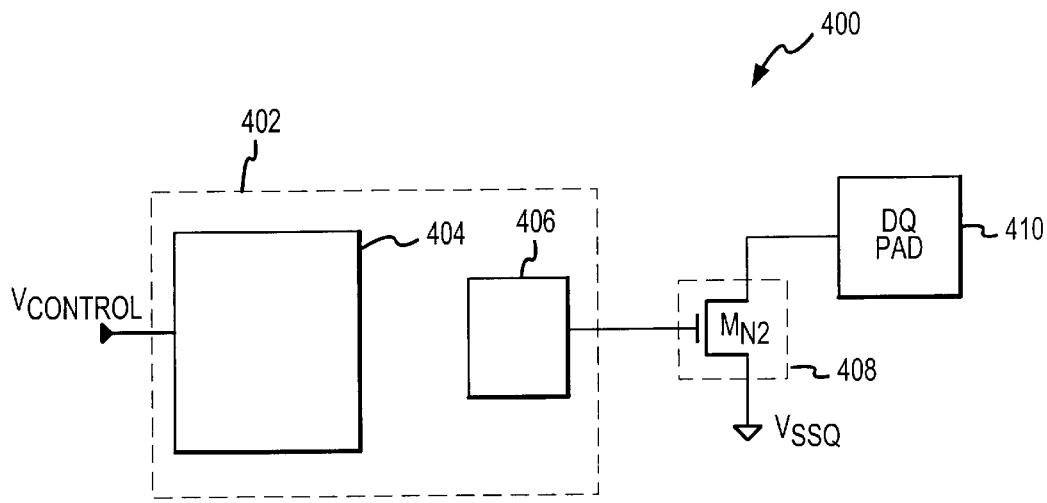
FIG. 4 illustrates an exemplary embodiment of a regulated predriver circuit for an output buffer pull-down element in accordance with the present invention.

With reference to FIG. 4, an output buffer 400 in accordance with an exemplary embodiment of the present invention suitably comprises a predriver circuit 402 and a pull-down element 408, e.g., a transistor device $M_{N2}$. Predriver circuit 402 is configured to drive a voltage to the gate of pull-down transistor device $M_{N2}$. Predriver circuit 402 comprises one or more predriver transistors 404, for example a p-channel transistor and an n-channel transistor, and a regulated limiter circuit 406. Limiter circuit 406 is configured to limit or otherwise regulate the maximum gate voltage provided to the gate of output pull-down transistor device 408. Limiter circuit 406 is configured between at least one predriver transistor and pull-down transistor device $M_{N2}$. Pull-down transistor device $M_{N2}$ is further connected to a bondpad 418.

In accordance with an exemplary embodiment, the regulated limiter circuit 406 can comprise an n-channel transistor connected to the gate of n-channel pull-down transistor $M_{N2}$. The n-channel limiter device is configured to limit the maximum gate voltage of the output pull-down transistor to less than the externally power supply voltage, without reducing the gate voltage below the minimum voltage specification.

Figure 5:
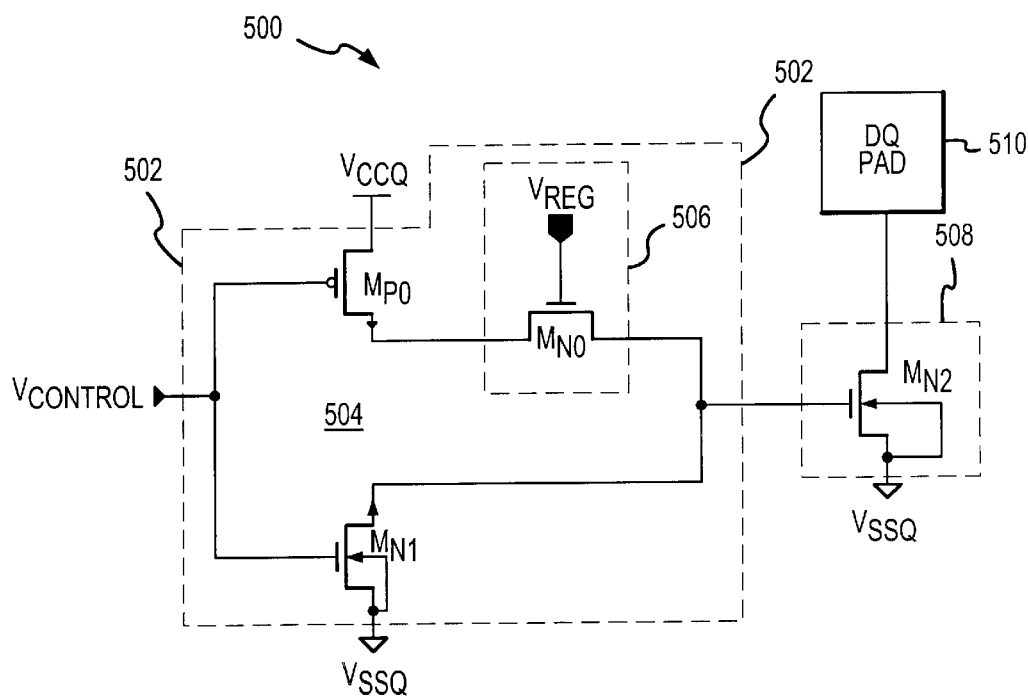
FIGS. 5–9 illustrate various other exemplary embodiments of a regulated predriver circuit for an output buffer pull-down element in accordance with the present invention.

For example, with reference to FIG. 5, an exemplary output buffer 500 suitably comprises a predriver circuit 502 and a pull-down transistor device 508. Predriver circuit 502 is configured to drive a voltage to the gate of pull-down transistor device 508. Predriver circuit 502 comprises a pair of input transistors 504, including a p-channel transistor $M_{P0}$ and an n-channel transistor $M_{N1}$, and a regulated limiter device 506. Output pull-down transistor device 508 comprises an n-channel transistor $M_{N2}$ configured for providing an output for output buffer 500. Pull-down transistor $M_{N2}$ includes a source coupled to supply rail $V_{SSQ}$; however, pull-down transistor $M_{N2}$ can also have the source connected to ground or other reference potential. In addition, the bulk connection of pull-down transistor device $M_{N2}$ can also be connected or otherwise coupled to supply rail $V_{SSQ}$.

For input pair of transistors 504, transistor $M_{P0}$ includes a source coupled to external voltage $V_{CCQ}$, such as, for example, an externally regulated supply voltage from 3.0 volts to 3.6 volts. Meanwhile, transistor $M_{N1}$ includes a source coupled to supply rail $V_{SSQ}$; however, transistor $M_{N1}$ can also have the source coupled to ground or other reference potential. In addition, the bulk connection of transistor $M_{N1}$ can also be coupled to supply rail $V_{SSQ}$. Transistors $M_{P0}$ and $M_{N1}$ include gates coupled to a control signal $V_{CONTROL}$ configured for control of operation of predriver circuit 502. For example, when control signal $V_{CONTROL}$ is high, transistor $M_{N1}$ connects the gate of pull-down transistor $M_{N2}$ to supply rail $V_{SSQ}$, and when control signal $V_{CONTROL}$ is low, transistor $M_{P0}$ connects the gate of pull-down transistor $M_{N2}$ through limiter circuit 506 to externally supplied voltage $V_{CCQ}$.

Limiter circuit 506 is configured to limit or otherwise regulate the maximum gate voltage provided to the gate of output pull-down transistor device 508. In accordance with this exemplary embodiment, limiter circuit 506 comprises an n-channel transistor $M_{N0}$ coupled to the gate of output pull-down transistor 508, e.g., coupled in series between the drain of transistor $M_{P0}$ and the gate of pull-down n-channel transistor $M_{N2}$. N-channel transistor $M_{N0}$ includes a gate terminal configured to receive an internally generated regulated voltage $V_{REG}$. For example, internally generated regulated voltage $V_{REG}$ can comprise a boosted signal $V_{CCP}$ derived from a regulated supply $V_{CCR}$ of 1.8 volts plus two times the transistor $M_{N0}$'s threshold voltage $V_{TN}$ of 0.7 volts, for a total of 3.2 volts. However, internally generated regulated voltage $V_{REG}$ can comprise any other value of regulated voltage supply.

In addition to limiting the gate voltage to pull-down transistor device $M_{N2}$, n-channel transistor $M_{N0}$ can also be configured to limit the slew rate of predriver circuit 502. However, depending on the width/length (W/L) ratios of transistors $M_{N0}$ and $M_{P0}$, either of transistors $M_{N0}$ and $M_{P0}$, or other circuit elements, can be configured to suitably limit the slew rate of predriver circuit 502.

During operation, limiter device 506 is configured such that the maximum value of gate voltage $V_{GATE}$ that can be provided to the gate of output pull-down transistor device 508 is limited to the internally generated regulated voltage $V_{REG}$ less the threshold voltage $V_{TN}$ of n-channel transistor device $M_{N0}$, i.e., $V_{GMAX} = V_{REG} - V_{TN}$. When control signal $V_{CONTROL}$ is low, p-channel transistor device $M_{P0}$ turns on and provides the supply rail $V_{CCQ}$ voltage to the source of n-channel transistor device $M_{N0}$, which in turn provides a regulated voltage to the gate of output pull-down transistor device 508 as limited by the maximum gate voltage $V_{GMAX}$; when control signal $V_{CONTROL}$ is high, p-channel transistor device $M_{P0}$ turns off, n-channel transistor device $M_{N1}$ turns on and provides supply rail $V_{SSQ}$, e.g., ground, to the gate of output pull-down transistor device 508.

Thus, when supply rail $V_{CCQ}$ is lower than the maximum gate voltage $V_{GMAX}$, i.e., the internally generated regulated voltage $V_{REG}$ less the threshold voltage $V_{TN}$ of n-channel transistor device $M_{N0}$, the voltage of supply rail $V_{CCQ}$ is provided through n-channel transistor device $M_{N0}$ to the gate of pull-down n-channel transistor $M_{N2}$. However, when supply rail $V_{CCQ}$ is higher than the maximum gate voltage $V_{GMAX}$, the voltage that is provided through n-channel transistor device $M_{N0}$ to the gate of pull-down n-channel transistor $M_{N2}$ is limited to the internally generated regulated voltage $V_{REG}$ less the threshold voltage $V_{TN}$ of n-channel transistor device $M_{N0}$, i.e., is limited to the maximum gate voltage $V_{GMAX}$.

For example, for an application in which internally generated regulated voltage $V_{REG}$ comprises 3.2 volts, and for a threshold voltage $V_{TN}$ of n-channel transistor device $M_{N0}$ of 0.7 volts, limiter circuit 506 suitably limits the amount of voltage provided to the gate of pull-down n-channel transistor $M_{N2}$ to 2.5 volts, i.e., $V_{GMAX} = 2.5$ volts. Thus, when supply rail $V_{CCQ}$ comprises 2.5 volts or less, essentially all of the voltage of supply rail $V_{CCQ}$ can be provided to the gate of pull-down n-channel transistor $M_{N2}$. However, any voltage for supply rail $V_{CCQ}$ greater than 2.5 volts is effectively limited, i.e., the maximum gate voltage provided to the gate of output pull-down transistor device 508 is regulated by limiter circuit 506. Accordingly, use of predriver circuit 502 having a limiter circuit 506 can enable the use of a smaller sized pull-down transistor $M_{N2}$ compared to that required using a lower internally regulated voltage, e.g., a voltage $V_{CCR}$ of 1.8 volts, to drive the gate of pull-down transistor $M_{N2}$.

In accordance with another aspect of the present invention, predriver circuit 502 suitably eliminates the need for an additional regulator to supply power to output buffer 500. Implementing additional regulated supplies requires additional regulator circuits within the integrated circuit chip for supplying switching current to output pull-down transistor device 508, thus significantly increasing the number of transistors, as well as the amount of silicon area consumed.

Figure 10:
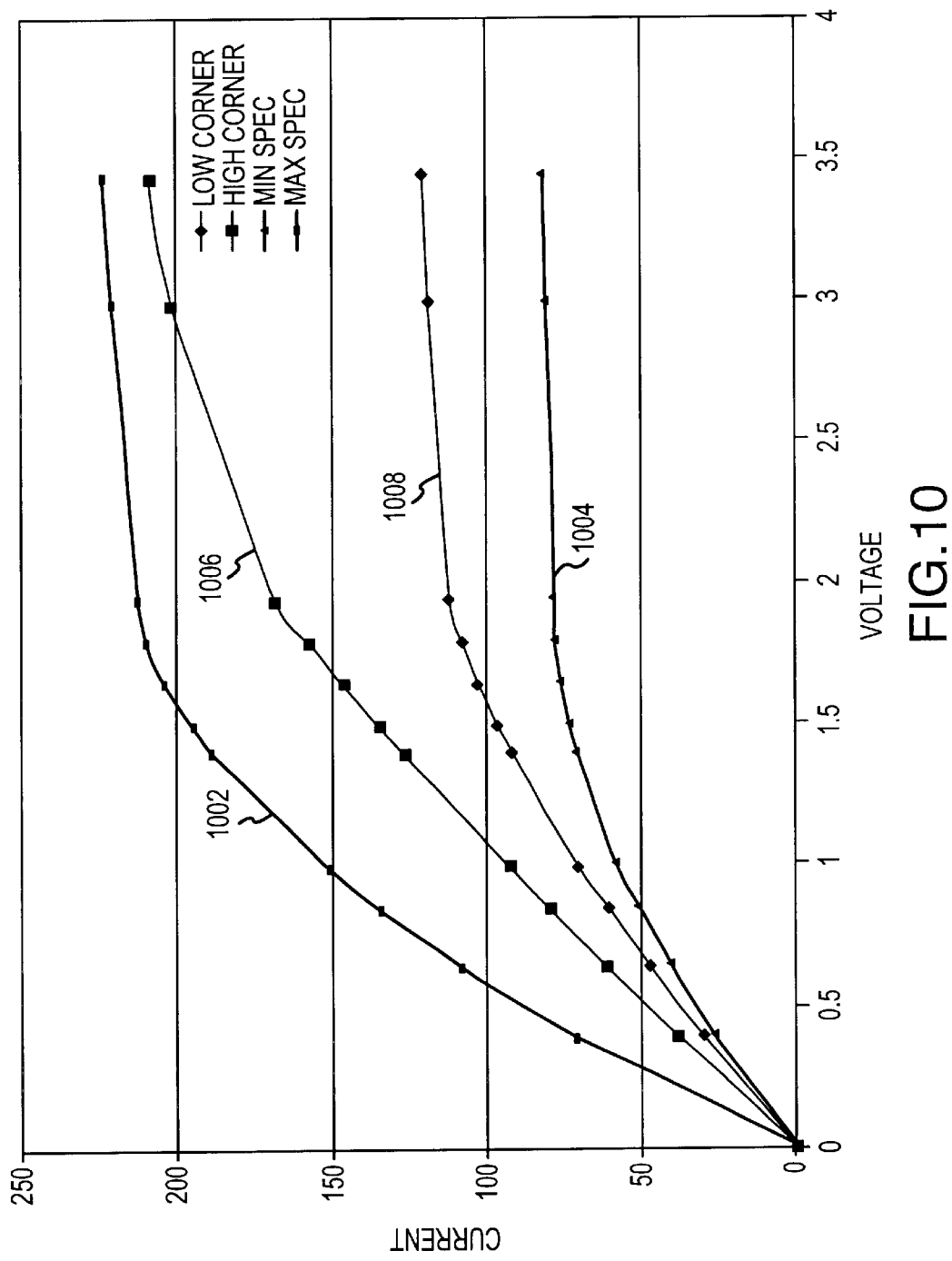
FIG. 10 illustrates an I-V diagram for operation for a pull-down element configured with a regulated predriver for an output buffer in accordance with an exemplary embodiment of the present invention

To further appreciate the improvements provided by predriver circuit 502, with reference to FIG. 10, an I-V diagram of the output of pull-down transistor $M_{N2}$ for output buffer 500 includes a curve 1002 representing the maximum IOL current specification and a cure 1004 representing the minimum IOL current specification. In accordance with the exemplary embodiment of output buffer 500, output pull-down transistor $M_{N2}$ can be configured such that an IOL current characteristic representative of output pull-down transistor $M_{N2}$ under lowest input/output conditions, i.e., higher temperature, lower IDS process corner, and lower supply voltage $V_{CCQ}$, is illustrated by curve 1008, while an IOL current characteristic representative of output pull-down transistor $M_{N2}$ under highest input/output conditions, i.e., lower temperature, higher IDS process corner, higher supply voltage $V_{CCQ}$, can be illustrated by curve 1006. As is evident from FIG. 10, curves 1006 and 1008 are relatively centralized, and thus adjustments to output pull-down transistor $M_{N2}$ of output buffer 500 are more readily attainable and flexible. In other words, the variation of the gate voltage is significantly smaller, as demonstrated by the reduced spread of the I-V characteristics, thus permitting greater flexibility in design of output buffer 500.

Pull-down transistor 508 operates in the linear region when the drain-source voltage $V_{DS}$ is less than the gate-source voltage $V_{GS}$ less the threshold voltage $V_{TN}$, i.e., when $V_{DS}$ is less than 2 volts, with a "knee" occurring when $V_{DS}=V_{GS}-V_{TN}$. Since the source voltage is ground, when the drain voltage $V_D$ exceeds the gate voltage $V_{GATE}$ less the threshold voltage $V_{TN}$, pull-down transistor 508 enters saturation, as evidenced by the flatter slope of the I-V characteristics beyond 2 volts. Accordingly, by reducing the maximum gate voltage provided to output pull-down transistor device 508, transistor $M_{N2}$ can reach saturation at a lower drain voltage and have an I-V characteristic more closely parallel to maximum IOL current specification 402.

Although limiter circuit 506 is illustrated as an n-channel transistor device $M_{N0}$ in accordance with one exemplary embodiment, limiter circuit 506 can comprise any other arrangement of transistor devices, switches and components configured to limit or otherwise regulate the maximum gate voltage provided to the gate of output pull-down transistor device 508. In other words, in addition to an n-channel transistor $M_{N0}$ being configured in series between the drain of transistor $M_{P0}$ and the gate of pull-down n-channel transistor $M_{N2}$, as illustrated in FIG. 5, a limiter circuit can be configured between the drains of the input pair of predriver transistors and the gate of the pull-down n-channel transistor.

Figure 6:
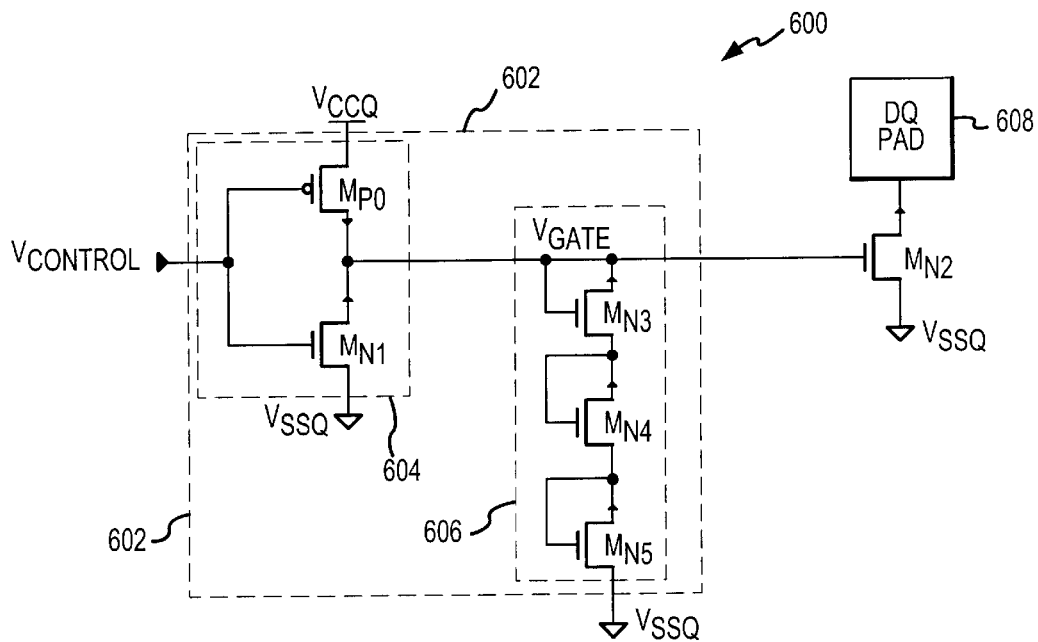

For example, with reference to an output buffer 600 illustrated in FIG. 6, a limiter circuit 606 can be configured in an n-channel diode clamp arrangement between predriver transistors $M_{P0}$ and $M_{N1}$ and the gate of pull-down n-channel transistor $M_{N2}$. Limiter circuit 606 comprises one or more diode-connected, n-channel devices, e.g., n-channel transistors $M_{N3}$, $M_{N4}$, and $M_{N5}$. Gate voltage $V_{GATE}$ is limited by the number of n-channel devices times the threshold voltage $V_{TN}$, e.g., for $3 \times V_{TN}$, with a threshold voltage $V_{TN}=0.8$ volts, $V_{GATE}$ is limited to 2.4 volts.

Figure 7:
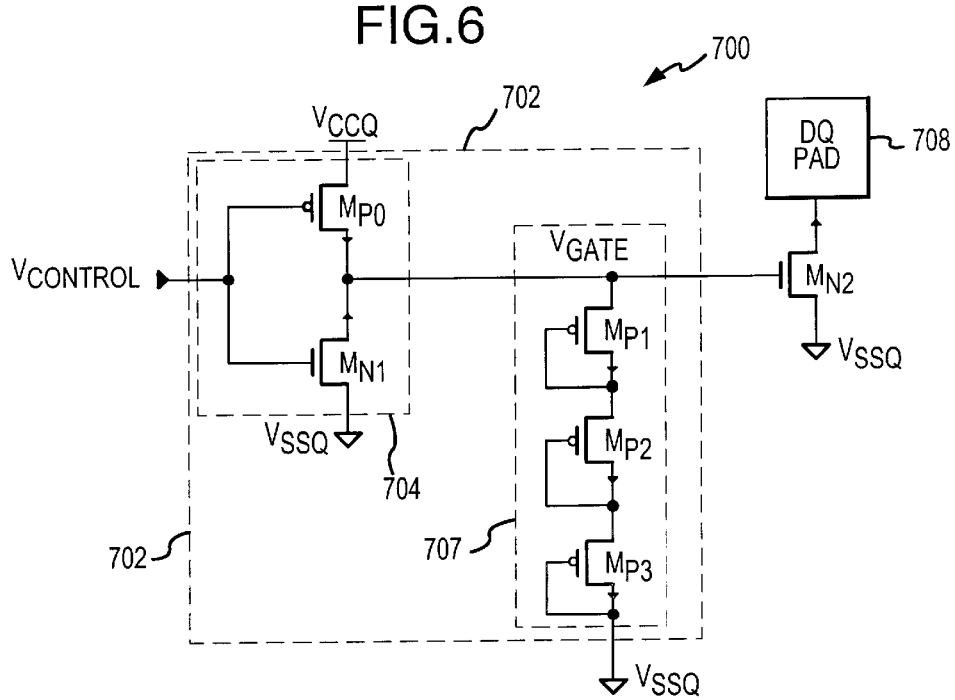
Figure 8:
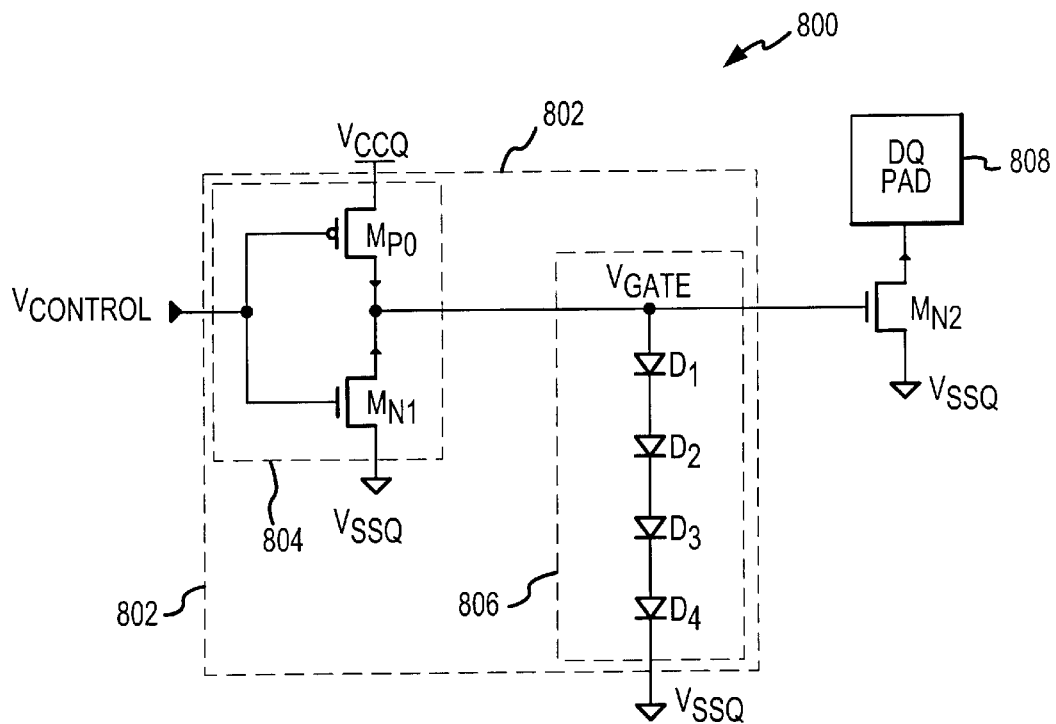

In addition, with reference to an output buffer 700 illustrated in FIG. 7, a limiter circuit 706 can also be configured in an p-channel diode clamp arrangement. Limiter circuit 706 comprises one or more p-channel devices connected in a diode manner, e.g., p-channel transistors $M_{P1}$, $M_{P2}$, and $M_{P3}$. Again, gate voltage $V_{GATE}$ is limited by the number of p-channel devices times the threshold voltage $V_{TP}$, e.g., for $3 \times V_{TP}$, with a threshold voltage $V_{TP}=0.9$ volts, $V_{GATE}$ is limited to 2.7 volts. Still further, instead of using diode-connected p-channel or n-channel transistors, with reference to an output suffer 800 illustrated in FIG. 8, a limiter circuit 806 can also be configured with one or more diodes, e.g., diodes $D_1$, $D_2$, $D_3$ and $D_4$. Thus, for four diodes and a threshold voltage $V_{TH}=0.7$ volts, $V_{GATE}$ is limited to 2.8 volts.

Figure 9:
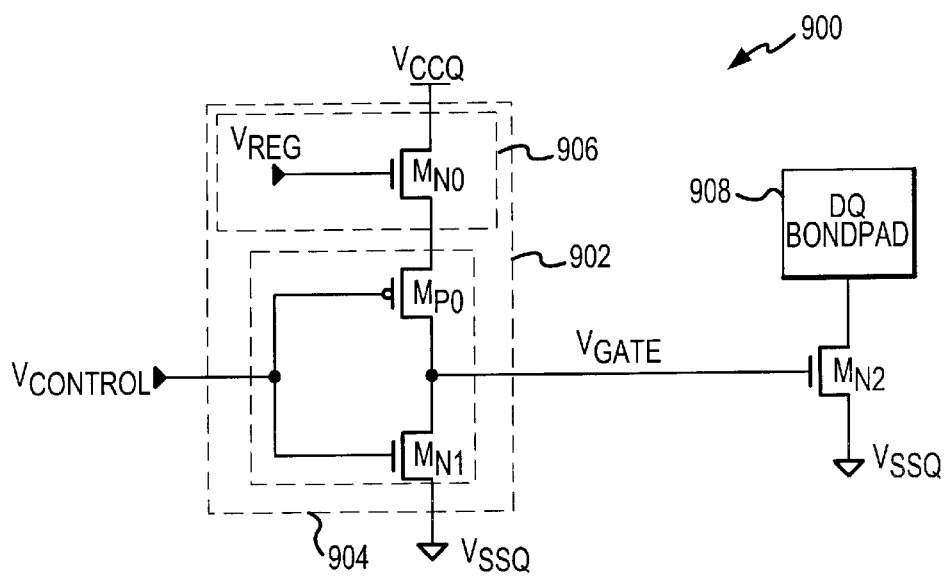

In addition to limiter circuits being configured in series with a drain of a p-channel predriver transistor, or in between two predriver transistors and the pull-down transistor, an exemplary limiter circuit can be configured in series with the source of a p-channel device. For example, with reference to another exemplary embodiment illustrated in FIG. 9, an output buffer 900 can comprise a limiter circuit 906 having an n-channel transistor $M_{N0}$ configured in series between external supplied voltage $V_{CCQ}$ and the source of p-channel transistor $M_{P0}$. In addition to regulating or otherwise limiting gate voltage $V_{GATE}$, limiter circuit 906 also limits the flow of current through predriver transistor $M_{P0}$.

Moreover, in addition to the embodiments illustrated in FIGS. 6–9, other exemplary embodiments of limiter circuits including fewer or more n-channel devices, p-channel devices, diodes, or combinations thereof, configured in various manners with one or more predriver transistors, or even different threshold voltages, can be suitably utilized to provide other gate voltage limitations. Accordingly, a limiter circuit can be configured in any arrangement configured to limit, clamp or otherwise regulate the gate voltage provided to a pull-down transistor device.

The present invention has been described above with reference to various exemplary embodiments. However, those skilled in the art will recognize that changes and modifications may be made to the exemplary embodiments without departing from the scope of the present invention. In addition, any type of transistor devices configured for performing the intended functions can be utilized. These and other changes or modifications are intended to be included within the scope of the present invention, as set forth in the following claims.

What is claimed is:

1. An output buffer configured for use within SDRAM applications, said output buffer comprising:
   an output element configured for providing an output for said output buffer; and
   a predriver circuit configured to control said output element and comprising a limiter circuit configured for limiting a maximum voltage provided from said predriver circuit to said output element.

2. The output buffer according to claim 1, wherein said predriver circuit further comprises at least one predriver pull-up transistor configured between an external supply voltage and said limiter circuit.

3. The output buffer according to claim 2, wherein said predriver circuit further comprises a p-channel pull-up transistor device and an n-channel pull-down transistor device, each of said p-channel pull-up transistor device and said n-channel pull-down transistor device having control terminals configured to receive a control signal, and wherein said limiter circuit is coupled in series between an output terminal of said p-channel pull-up transistor device and said output element.

4. The output buffer according to claim 2, wherein said limiter circuit comprises an n-channel transistor device coupled between said predriver pull-up transistor and said output element.

5. The output buffer according to claim 2, wherein said limiter circuit comprises at least one diode-connected, n-channel transistor device having a terminal connected between said predriver pull-up transistor and said output element.

6. The output buffer according to claim 2, wherein said limiter circuit comprises at least one diode-connected, p-channel transistor device having an output terminal connected between an output terminal of said predriver pull-up transistor and said output element.

7. The output buffer according to claim 2, wherein said limiter circuit comprises at least one diode device connected between an output terminal of said predriver pull-up transistor and said output element.

8. The output buffer according to claim 2, wherein said predriver pull-up transistor is coupled to an external supply voltage, and wherein a full amount of said external supply voltage is provided to said gate of said output element so long as said full amount of said external supply voltage is less than said maximum voltage.

9. The output buffer according to claim 1, wherein said limiter circuit comprises an n-channel transistor device coupled between an external supply voltage and an input terminal of said predriver pull-up transistor.

10. The output buffer according to claim 1, wherein said limiter circuit is coupled to an internally generated regulated voltage, and said maximum voltage comprises the difference between said internally generated regulated voltage and a threshold voltage of said limiter circuit.

11. A predriver circuit for providing a gate voltage to an output pull-down device of an output buffer, said predriver circuit comprising:
at least one predriver pull-up transistor configured to receive a control signal; and
a limiter device coupled between said at least one predriver pull-up transistor and a gate of the output pull-down device, said limiter device being configured to limit a maximum voltage for the output pull-down device.

12. The predriver circuit according to claim 11, wherein said at least one predriver pull-up transistor comprises a p-channel transistor device having a gate configured to receive said control signal.

13. The predriver circuit according to claim 12, wherein said limiter device comprises an n-channel transistor device coupled in series between said predriver pull-up transistor and the gate of said output pull-down device.

14. The predriver circuit according to claim 12, wherein said limiter device comprises a plurality of n-channel transistor devices connected in series, each of said plurality of n-channel transistor devices comprising a diode-configuration, and one of said plurality of n-channel transistor devices having a gate terminal connected between said predriver pull-up transistor and the gate of said output pull-down device.

15. The predriver circuit according to claim 12, wherein said limiter device comprises a plurality of p-channel transistor devices connected in series, each of said plurality of p-channel transistor devices comprising a diode-configuration, and one of said plurality of p-channel transistor devices having a gate terminal connected between said predriver pull-up transistor and the gate of said output pull-down device.

16. The predriver circuit according to claim 12, wherein said limiter device comprises a plurality of diode devices connected in series, with one of said plurality of diode devices having an anode terminal connected between said predriver pull-up transistor and the gate of said output pull-down device.

17. The predriver circuit according to claim 12, wherein said limiter device and said predriver pull-up transistor can be configured to limit slewing of the output buffer based on respective width/length ratios.

18. A method for limiting a maximum gate voltage of an output element in an output buffer, said method comprising the steps of:
receiving a control signal at a control terminal of a predriver pull-up device of a predriver circuit;
providing said maximum gate voltage from said predriver pull-up device to a limiter circuit of said predriver circuit, said limiter device configured between said predriver pull-up device and said output element; and
limiting said maximum gate voltage provided through said limiter circuit to said output element.

19. The method according to claim 18, wherein said step of limiting said maximum gate voltage comprises limiting said maximum gate voltage to an amount not greater than an internally regulated voltage less a threshold voltage of said limiter circuit.

20. The method according to claim 19, wherein said method further comprises the step of reducing a maximum current in an I-V characteristic of said output element.

21. The method according to claim 19, wherein said step of limiting said maximum gate voltage comprises limiting said maximum gate voltage through clamping of said maximum gate voltage based on a diode configuration of said limiter circuit.

22. The method according to claim 21, wherein said step of limiting said maximum gate voltage comprises limiting said maximum gate voltage through clamping of said maximum gate voltage through at least one of a plurality of diode-connected p-channel transistors and a plurality of diode-connected n-channel transistors.

23. An SDRAM output buffer comprising:
a predriver circuit comprising a predriver pull-up transistor coupled to a limiter circuit, said limiter circuit being configured for limiting a maximum voltage provided from said predriver circuit; and
an output pull-down transistor device configured for providing an output for said SDRAM output buffer, said output pull-down transistor device having a control terminal coupled to said limiter circuit.

24. The SDRAM output buffer according to claim 23, wherein said limiter circuit comprises a plurality of diode configured devices, with at least one of said plurality of diode configured devices connected between said predriver pull-up transistor and said control terminal of said output pull-down transistor device.

25. The SDRAM output buffer according to claim 23, wherein said predriver circuit further comprises a p-channel pull-up transistor device and a n-channel pull-down transistor device, each of said pull-up transistor device and said pull-down transistor device having control terminals configured to receive a control signal, and wherein said limiter device is coupled in series between said pull-up transistor device and said control terminal of said output pull-down transistor device.

26. A memory system having an output buffer configured for providing an operating voltage to a memory device, said output buffer comprising:

an output element configured for providing an output for said output buffer; and a predriver circuit configured to control said output element and comprising a limiter circuit configured for limiting a maximum voltage provided from said predriver circuit to said output element.

27. The memory system according to claim 26, wherein said predriver circuit further comprises at least one predriver pull-up transistor configured between an external supply voltage and said limiter circuit.

28. The memory system according to claim 27, wherein said predriver circuit further comprises a p-channel pull-up transistor device and an n-channel pull-down transistor device, each of said p-channel pull-up transistor device and said n-channel pull-down transistor device having control terminals configured to receive a control signal, and wherein said limiter circuit is coupled between an output terminal of said p-channel pull-up transistor device and said output element.

29. The memory system according to claim 27, wherein said limiter circuit comprises an n-channel transistor device coupled between said predriver pull-up transistor and said output element.

30. The memory system according to claim 27, wherein said limiter circuit comprises at least one diode-connected, n-channel transistor device having a terminal connected between said predriver pull-up transistor and said output element.

31. The memory system according to claim 27, wherein said limiter circuit comprises at least one diode-connected, p-channel transistor device having an output terminal connected between an output terminal of said predriver pull-up transistor and said output element.

32. The memory system according to claim 27, wherein said limiter circuit comprises at least one diode device connected between an output terminal of said predriver pull-up transistor and said output element.

33. The memory system according to claim 27, wherein said predriver pull-up transistor is coupled to an external supply voltage, and wherein a full amount of said external supply voltage is provided to said gate of said output element so long as said full amount of said external supply voltage is less than said maximum voltage.

34. The memory system according to claim 26, wherein said limiter circuit comprises an n-channel transistor device coupled between an external supply voltage and an input terminal of said predriver pull-up transistor.

35. The memory system according to claim 26, wherein said limiter circuit is coupled to an internally generated regulated voltage, and said maximum voltage comprises the difference between said internally generated regulated voltage and a threshold voltage of said limiter circuit.

36. An electronic system comprising a processor, a supply and a memory system, said memory system having an output buffer comprising:

a predriver circuit comprising a predriver pull-up device coupled to a limiter circuit, said limiter circuit being configured for limiting a maximum voltage provided from said predriver circuit; and an output element configured for providing an output for said output buffer, said output element having a control terminal coupled to said limiter circuit.

37. The electronic system according to claim 36, wherein said limiter device comprises a plurality of diode configured devices, with at least one of said plurality of diode configured devices connected between said predriver pull-up device and said control terminal of said output element.

38. The electronic system according to claim 36, wherein said predriver circuit further comprises a p-channel pull-up transistor device and a n-channel pull-down transistor device, each of said pull-up transistor device and said pull-down transistor device having control terminals configured to receive a control signal, and wherein said limiter device is coupled between said pull-up transistor device and said control terminal of said output element.

* * * * *